United States Patent [19]

Kondo

[11] Patent Number: 4,874,964
[45] Date of Patent: Oct. 17, 1989

[54] CURRENT GENERATING CIRCUIT

[75] Inventor: Tetsuya Kondo, Kanagawa, Japan

[73] Assignee: Sony Corporation, Tokyo, Japan

[21] Appl. No.: 184,126

[22] Filed: Apr. 20, 1988

[30] Foreign Application Priority Data

May 28, 1987 [JP] Japan .................................. 62-132398
May 29, 1987 [JP] Japan .................................. 62-135529

[51] Int. Cl.$^4$ ......................... H03K 3/02; H03M 1/00
[52] U.S. Cl. .................................. 307/270; 307/244;
307/254; 341/144
[58] Field of Search ............... 307/241, 244, 254, 571,
307/270; 340/347 AD, 347 M; 341/127, 144

[56] References Cited

U.S. PATENT DOCUMENTS 3,446,989 5/1969 Allen et al. ........................ 307/244
3,839,648 10/1974 Pace .................................... 307/254
4,536,701 8/1985 Nagano ............................... 307/254

FOREIGN PATENT DOCUMENTS 6130452 12/1981 Japan .
7017918 6/1972 Netherlands .
7604570 11/1977 Netherlands .

Primary Examiner—John Zazworsky
Attorney, Agent, or Firm—Lewis H. Eslinger; Jay H. Maioli

[57] ABSTRACT

A current generating circuit for dividing a current (Dynamic Element Matching) in which a portion of a plurality of transistors constituting change-over circuits arranged therein is removed by weighting the transistors for the operating periods thereof, to thereby largely reduce the number of elements, particularly in the case where a large number of bits are processed. Since the number of bits which each current generating circuit can process can be increased, the number of elements can be easily decreased, so that a source voltage can be reduced when the current generating circuits are connected in multiple stages (in a vertical piling). Further, transistors constituting switching circuits are connected in a Darlington configuration to expand the operating range (dynamic range) of the circuit.

10 Claims, 7 Drawing Sheets

CURRENT GENERATING CIRCUIT

BACKGROUND OF THE INVENTION

1. Field of the Invention

This invention relates generally to a current generating (dynamic element matching) circuit, and more particularly to such a current generating circuit which is suitable for use in current switching for a digital-to-analog (D/A) converter.

2. Description of the Prior Art

First, a previously proposed current generating circuit 4, disclosed in Japanese Patent Publication No. 54-24098, will hereinafter be explained with reference to FIG. 1.

The current generating circuit 4 comprises a current dividing circuit 3 in a current mirror configuration which is formed of transistors $Q_1$ and $Q_2$. Currents $I_1$ and $I_2$ passing through the transistors $Q_1$ and $Q_2$ are respectively obtained by dividing a current 2I substantially by two, so that the currents $I_1$ and $I_2$ are substantially equal to each other. A pair of differential switching circuits 1a and 1b, which form a current change-over circuit 2, respectively switch and deliver the currents $I_1$ and $I_2$ alternately to a pair of output terminals $T_3$ and $T_4$. The differential switching circuit 1a is formed of a pair of transistors $Q_3$ and $Q_4$ which have their emitters connected with each other, and their connecting point is connected with the collector and the base of the transistor $Q_1$. The other differential switching circuit 1b is formed of a pair of transistors $Q_5$ and $Q_6$ which have their emitters connected with each other, and their connecting point is connected with the collector of the transistor $Q_2$.

The collectors of the transistors $Q_3$ and $Q_5$ are connected to the output terminal $T_3$ in common, while the collectors of the transistors $Q_4$ and $Q_6$ are to the other output terminal $T_4$ in common. The output terminals $T_3$ and $T_4$ are grounded respectively through capacitors Cx and Cy constituting low pass filters.

The input terminals $T_1$ and $T_2$, for switching, are fed with a pair of opposite-phased switching signals $E_1$ and $E_2$ with a predetermined frequency. The switching input terminal $T_1$ is connected to the bases of the transistors $Q_3$ and $Q_6$ in common, while the other switching input terminal $T_2$ is connected to the bases of the transistors $Q_4$ and $Q_5$ in common.

Next, the operation of the current generating circuit 4 will be explained. When the switching signal $E_1$ supplied to the input terminal $T_1$ is at a high level, the switching signal $E_2$ supplied to the input terminal $T_2$ is at a low level, so that the transistors $Q_3$ and $Q_6$ are turned on while the transistors $Q_4$ and $Q_5$ are turned off. Therefore, the current $I_1$ from the current dividing circuit 3 is delivered to the terminal $T_3$ and the current $I_2$ is delivered to the terminal $T_4$, respectively.

When the switching signal $E_2$ supplied to the switching input terminal $T_2$ is at the high level, the switching signal $E_1$ supplied to the input terminal $T_1$ is at the low level, so that the transistors $Q_4$ and $Q_5$ are turned on while the transistors $Q_3$ and $Q_6$ are turned off. Therefore, the current $I_1$ from the current dividing circuit 3 is delivered to the terminal $T_4$ and the current $I_2$ is delivered to the terminal $T_3$, respectively.

Thus, the output terminal $T_3$ is alternately fed with the currents $I_1$ and $I_2$, while the output terminal $T_4$ is alternately fed with the currents $I_2$ and $I_1$. These currents $I_2$ and $I_1$ are averaged by the capacitors Cx and Cy constituting the low pass filters, so that both of the output terminals $T_3$ and $T_4$ are equally fed with a current I ($I=(I_1+I_2)/2$), as a result. In other words, the current generating circuit 4 can provide at its two output terminals the output current I which is derived by accurately dividing the input current 2I supplied thereto by two.

Let it now be assumed that the current generating circuits 4a, 4b and 4c, each being explained with reference to FIG. 1 as disclosed in Japanese Patent Publication No. 54-24098, are connected upward in a piling manner as shown in FIG. 2. The current generating circuit 4a at the first stage is disposed to divide the input current 2I by two to obtain the two output currents, I and I, one of which is delivered to the output terminal $T_4$, and the other of which is supplied to one input terminal of the current generating circuit 4b at the next stage.

Then, the current generating circuit 4b is disposed to divide the input current I by two to obtain two output currents I/2 and I/2, one of which is outputted to an output terminal $T_5$, and the other of which is supplied to one input terminal of the current generating circuit 4c at the third stage.

By repeating the above operation, the current generating circuit 4c at the third stage derives a current I/4 at its output terminal $T_6$. Incidentally, reference letters $T_3$, $T_3'$ and $T_3''$ designate the other output terminals of the current generating circuits 4a, 4b and 4c, respectively.

If each of the output currents delivered to the output terminals $T_4$, $T_5$ and $T_6$ are controlled independently by different switches which are turned on and off in accordance with binary combinations of a 3-bit digital signal, a current generator type D/A converter can be formed.

The current generating circuit 4 shown in FIG. 1 can derive the substantially equal current at the output terminals $T_3$ and $T_4$ by averaging the input currents $I_1$ and $I_2$ supplied to the differential type switching circuits 1a and 1b. However, if the current generating circuits are arranged in multi-stage as shown in FIG. 2, to form e.g. an n-bit D/A converter, the total number of the transistors $Q_3$ and $Q_4$, for example, in the differential switching circuit 1a is increased by n times, so that the voltage necessary to operate all these transistors $Q_3$ and $Q_4$ or the like becomes higher as the bit number of the D/A converter is increased.

To solve the above-mentioned problem, Japanese Patent Publication No. 57-31809 discloses to derive from the single current generating circuit 4 the output currents I, I/2, I/4 . . . which have been delivered one by one from the current generating circuits 4a, 4b, 4c . . . That is, the single current generating circuit provided with a plurality of output terminals for deriving a plurality of output currents, for example I and I/2, is disclosed. The construction shown in this document can reduce the number of the current generating circuits 4a, 4b, 4c . . . which are piled by connecting in multiple stages, as shown in FIG. 2, thereby making it possible to reduce the source voltage.

A single-stage current generating circuit equivalent to the above-mentioned two-stage current generating circuit and the operating waveforms thereof is explained below with reference to FIGS. 3 and 4, by using the principle of Japanese Patent Publication No. 57-31809.

In FIG. 3, reference numeral 4 designates an overall current generating circuit in which an input terminal $T_{15}$ is connected e.g. to a current generating circuit for the upper digit, and an output terminal $T_{14}$ to a current generating circuit for the lower digit, in a manner that they are piled in multiple stages, similarly to FIG. 2. The current dividing circuit 3 is formed of a current-mirror circuit comprising transistors $Q_{11}$, $Q_{12}$, $Q_{13}$ and $Q_{14}$, for dividing an input current I supplied to the input terminal $T_{15}$ substantially equally by four. That is, the input current is divided into $2^n$ (n=2, 3, 4 . . .). The collectors of the transistors $Q_{11}$ to $Q_{14}$ are connected to switching circuits 11, 12, 13 and 14, respectively, while the bases and the emitters thereof are respectively connected in common. The base of the transistor $Q_{11}$ is connected to the collector of the same. The switching circuits 11, 12, 13 and 14 are respectively formed of switching transistors $Q_{15}$ to $Q_{18}$, $Q_{19}$ to $Q_{22}$, $Q_{23}$ to $Q_{26}$ and $Q_{27}$ to $Q_{30}$. The emitters of the transistors $Q_{15}$ to $Q_{18}$, $Q_{19}$ to $Q_{22}$, $Q_{23}$ to $Q_{26}$ and $Q_{27}$ to $Q_{30}$ comprised in the switching circuits 11, 12, 13 and 14 are respectively connected in common. A control terminal $T_{10}$ is connected to the respective bases of the transistors $Q_{15}$, $Q_{19}$, $Q_{23}$ and $Q_{27}$, while a control terminal $T_{11}$ is connected to the respective bases of the transistors $Q_{16}$, $Q_{20}$, $Q_{24}$ and $Q_{28}$. Further, a control terminal $T_{12}$ is connected to the respective bases of the transistors $Q_{17}$, $Q_{21}$, $Q_{25}$ and $Q_{29}$, while a control terminal $T_{13}$ is connected to the respective bases of the transistors $Q_{18}$, $Q_{22}$, $Q_{26}$ and $Q_{30}$. The collectors of the transistors $Q_{15}$, $Q_{20}$, $Q_{25}$ and $Q_{30}$ arranged in the switching circuits 11 to 14 are connected in common to a first output terminal $T_{16}$. A capacitor $C_1$ forming a low pass filter is interposed between the first output terminal $T_{16}$ and ground. In the same manner, the collectors of the transistors $Q_{16}$, $Q_{21}$, $Q_{26}$, $Q_{27}$ and $Q_{30}$ are connected in common to the output terminal $T_{16}$. Further, the collectors of the transistors $Q_{17}$, $Q_{22}$, $Q_{23}$ and $Q_{28}$ are connected in common to a second output terminal $T_{17}$. A capacitor $C_2$ forming a low pass filter is interposed between the second output terminal $T_{17}$ and ground. Further in the same manner, the collectors of the transistors $Q_{18}$, $Q_{19}$, $Q_{24}$ and $Q_{29}$ are connected in common to the output terminal $T_{14}$ which leads to the current generating circuit for the lower digit. A capacitor $C_3$ forming a low pass filter is interposed between the output terminal $T_{14}$ and ground.

In the construction shown in FIG. 3, the control terminals $T_{10}$ to $T_{13}$ are respectively supplied with control pulses $A_1$ to $A_4$ as shown in FIG. 4. For example, when the control terminal $T_{10}$ is supplied with the pulse $A_1$, the transistors $Q_{15}$, $Q_{19}$, $Q_{23}$ and $Q_{27}$ are turned on and maintain the "on" condition as long as the pulse $A_1$ is at the high level, so that a current flows in the direction indicated by the arrow. The same operation is carried out with the pulses $A_2$ to $A_4$. When the current I is fed to the input terminal $T_{15}$, the current I/2 is derived at the first output terminal $T_{16}$ and the current I/4 is derived at the second output terminal $T_{17}$ and the terminal $T_{14}$.

With the circuit construction of FIG. 3 as described above, while the control terminals $T_{10}$ to $T_{13}$ are respectively applied with the pulsed $A_1$ to $A_4$ for one cyclic period thereof, the switching circuit 11 has the transistors $Q_{15}$ and $Q_{16}$, connected to the output terminal $T_{16}$ in common, turned on to flow the current to the transistor $Q_{11}$ arranged in the current dividing circuit 3. The switching circuit 12, in the same manner, has the transistors $Q_{20}$ and $Q_{21}$ turned on to flow the current to the transistor $Q_{12}$ in the current dividing circuit 3, the switching circuit 13 also has the transistor $Q_{25}$ and $Q_{26}$ turned on to flow the current to the transistor $Q_{13}$ in the current dividing circuit 3, and the switching circuit 14 has the transistors $Q_{27}$ and $Q_{30}$ turned on to flow the current to the transistor $Q_{14}$ of the current dividing circuit 3. Thus, if the number of the transistors arranged in the current dividing circuit 3 (the current source are increased to 2, 4, 8, 16 . . . $2_n$, or if the number of the processed bits (output derived at the output terminals $T_{16}$ and $T_{17}$) taken out from each of the current generating circuits 4a, 4b . . . connected in the piling manner as shown in FIG. 2 are increased to 1, 2, 3 ... n, the number of transistors in the switching circuits 11 to 14 for turning on and off each of the transistors in the current dividing circuit 3 is correspondingly increased to 2, 4, 8 ...$2_n$. Particularly, for realizing a highly accurate D/A converter the number of necessary transistors becomes inacceptably immense.

Further, the current change-over circuit 2 formed of the differential switches 1a and 1b shown in FIG. 1 presents another disadvantage in that the emitter currents of the respective transistors $Q_3$ to $Q_6$ thereof do not wholly flow to their collectors but the collector current is only, $\beta/(1+\beta)$, a portion of the emitter current and the rest, $1/(1+\beta)$, of the same flows to the base. In other words, the output currents delivered to the output terminals $T_3$ and $T_4$ are reduced by $1/(1+\beta)$ from $(I_1+I_2)/2$. Accordingly, if the current generating circuits of FIG. 1 are connected in multiple stages as shown in FIG. 2, the error in the output current becomes larger in further succeeding stages, so that if it is used as the aforementioned current source type D/A converter, there will be produced a large conversion error.

This problem can be solved by constructing the transistors $Q_3$ to $Q_6$ of the differential switching circuits 1a and 1b in the current change-over circuit 2 shown in FIG. 1 in a Darlington configuration to thereby make the $\beta$ factor substantially large.

FIG. 5 illustrates a circuit in which the differential switching circuit 1a, for example, of the current change-over circuit 2 in FIG. 1 is formed in a Darlington configuration. In this example, the transistor circuit $Q_3$ is formed of a pair of Darlington-connected transistors $Q_{3a}$ and $Q_{3b}$, and the transistor circuit $Q_4$ is formed of a pair of Darlington-connected transistors $Q_{4a}$ and $Q_{4b}$. Specifically, the emitter of the transistor $Q_{3b}$ is connected to the base of the transistor $Q_{3a}$, while the collector of the transistor $Q_{3a}$ is connected to the collector of the transistor $Q_{3b}$. The emitter of the transistor $Q_{4b}$ is connected to the base of the transistor $Q_{4a}$, while the collector of the transistor $Q_{4a}$ is connected to the collector of the transistor $Q_{4b}$.

Assuming that the factors $\beta$ of the transistors $Q_{3a}$ to $Q_{4b}$ are equal, the current flowing to the bases of the respective transistors $Q_{3b}$ and $Q_{4b}$ is represented by $I_1/(1+\beta)^2$. It is therefore understood that the accuracy of the output current for the input current is improved.

However, such a configuration causes a minimal operating voltage at the output terminals $T_3$ and $T_4$, on the basis of the common emitter of the transistors $Q_{3a}$ and $Q_{4a}$, to be twice the base-emitter voltage $V_{BE}$ of the transistors $Q_{3a}$ to $Q_{4b}$, that is, $2V_{BE}$. Therefore, if the current generating circuits are connected in multiple stages as shown in FIG. 2, the minimal operating voltage for the current generating circuit at the highest stage will be four times the value $2V_{BE}$. Thus, as the number of stages is increased, the minimal operating voltage thereof is largely elevated.

OBJECTS AND SUMMARY OF THE INVENTION

In view of the inconvenience mentioned above, it is an object of the present invention to provide a current generating circuit which is capable of reducing the number of transistors arranged in switching circuits thereof.

It is another object of the present invention to provide a current generating circuit which is capable of reducing the error occurring in the output currents with respect to the input current as well as preventing elevation of the minimal operating voltage when the current generating circuits are connected in multiple stages.

According to a first aspect of the present invention, there is provided a current generating circuit for generating a plurality of currents accurately in a predetermined integer ratio, comprising:

(a) a current dividing circuit for dividing an input current into $2^n$ (n is a positive integer);

(b) a plurality of current change-over circuits for dividing respective output currents from said current dividing circuit in a predetermined ratio by supplying to input terminals thereof a predetermined number of change-over clock signals in one cyclic period; and (c) a current synthesizing circuit for synthesizing the output currents from said respective current change-over circuits and generating currents in a predetermined ratio.

According to a second aspect of the present invention, there is provided a current generating circuit for generating a plurality of currents accurately in a predetermined integer ratio, comprising:

(a) at least two sets of first and second current dividing devices each comprising a current dividing circuit for dividing an input current into $2^n$ (n is a positive integer), a plurality of current change-over circuits for dividing respective output currents from said current dividing circuit in a predetermined ratio and a current synthesizing circuit for synthesizing the output currents from said respective current change-over circuits and generating currents in a predetermined ratio; and (b) a voltage compensating circuit connected between an output terminal of said second current generating circuit and an output terminal of said first current generating circuit for shifting the voltage level of a first input voltage.

These and other objects, features and advantages of the present invention will become apparent from the following detailed description of the preferred embodiments taken in conjunction with the accompanying drawings, throughout which like reference numerals designate like elements and parts.

DETAILED DESCRIPTION OF THE EMBODIMENT

Now, a first embodiment of a current generating circuit according to the present invention will hereinafter be described with reference to FIGS. 6 and 7.

Figure 3:
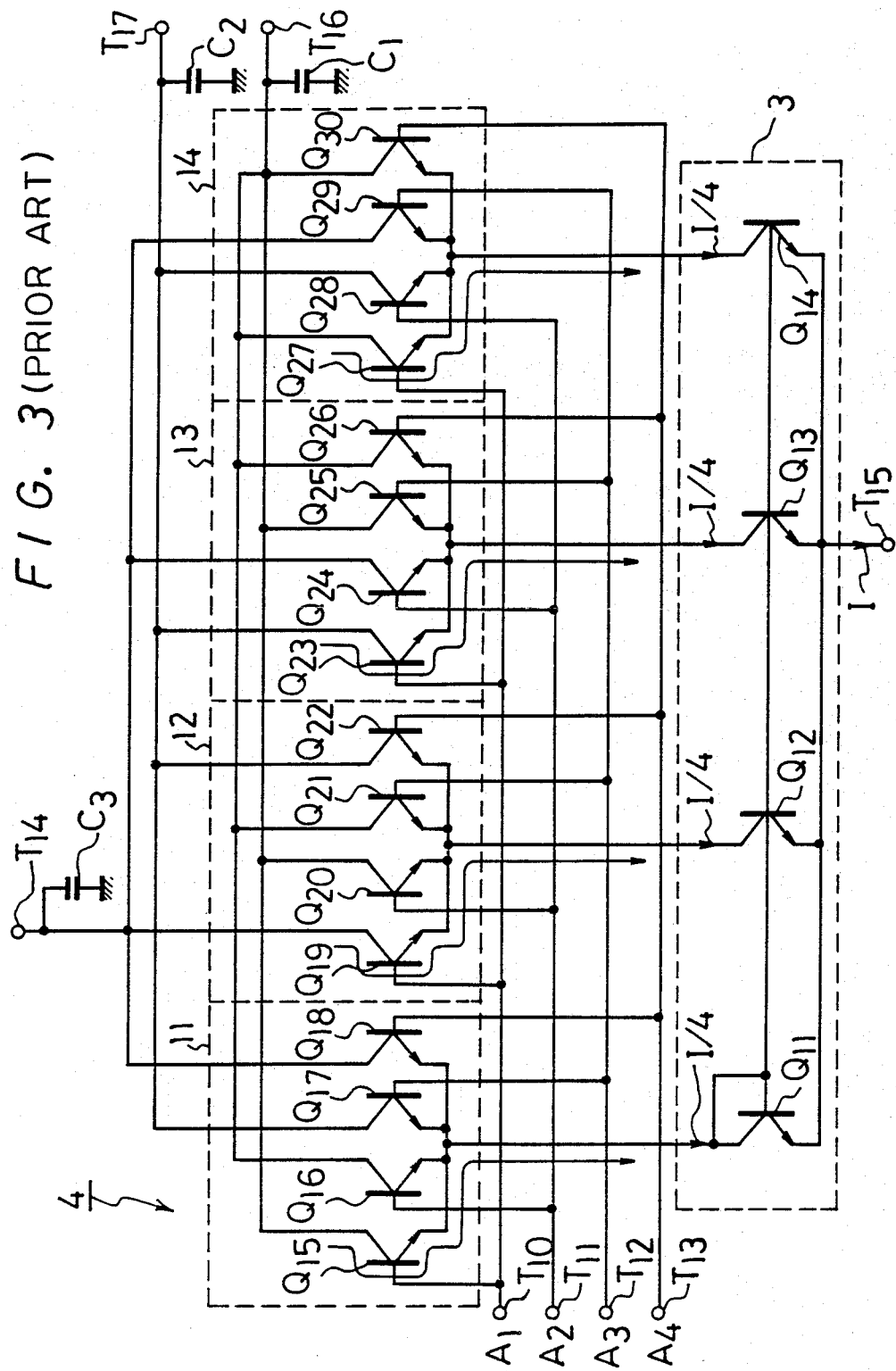
FIG. 3 is a schematic circuit diagram showing another previously proposed current generating circuit.
Figure 4:
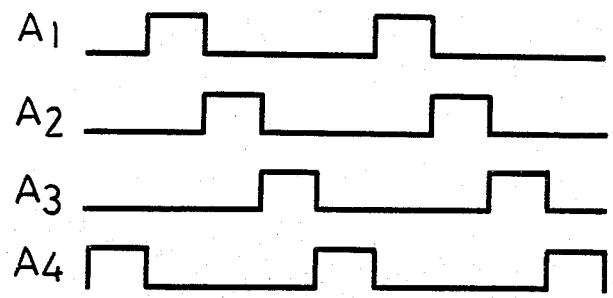
FIG. 4 is timing charts showing the waveforms of control pulses which are applied to the current generating circuit of FIG. 3.
Figure 7:
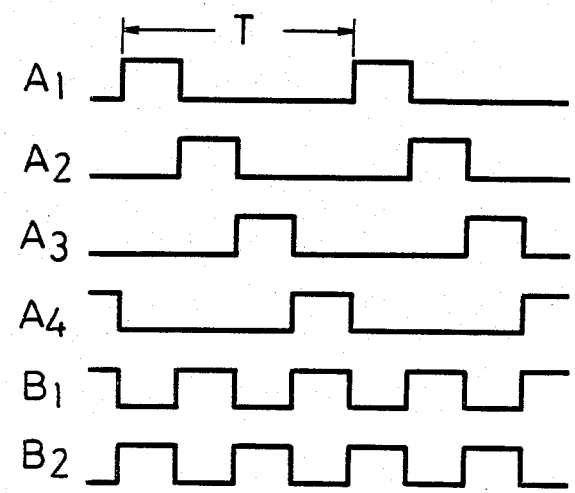
FIG. 7 is timing charts showing the waveforms of control pulses which are applied to the current generating circuit of FIG. 6.
Figure 5:
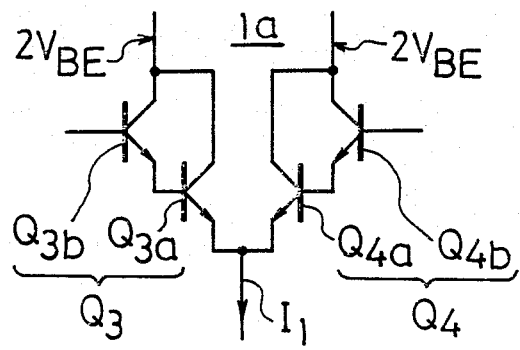
FIG. 5 is a schematic circuit diagram showing a previously proposed differential switching circuit.
Figure 6:
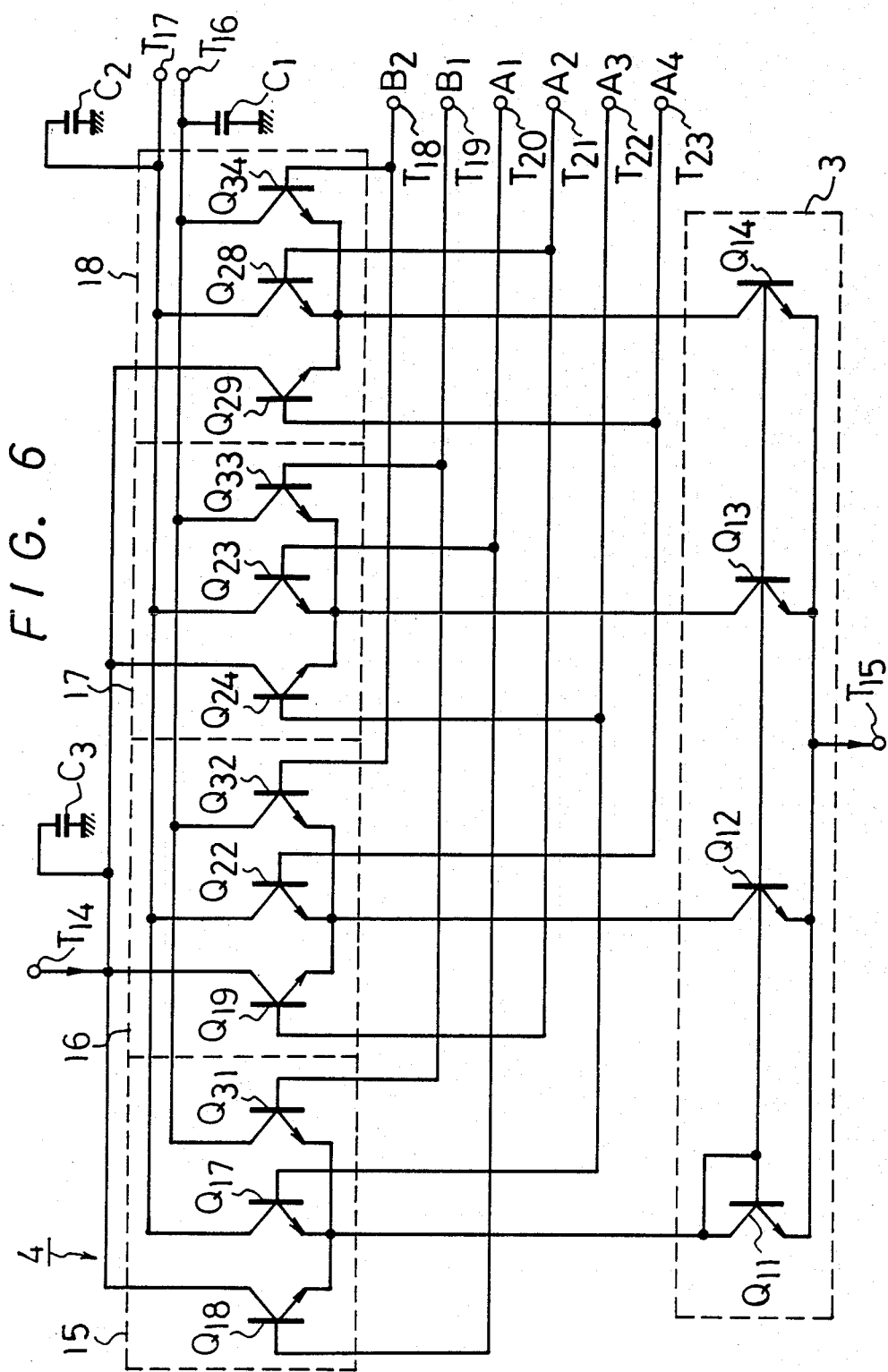
FIG. 6 is a schematic circuit diagram showing an embodiment of a current generating circuit according to the present invention.

FIG. 6 is a circuit diagram showing the first embodiment of the current generating circuit 4 according to the present invention, and FIG. 7 shows waveform charts of respective control signals supplied to control terminals shown in FIG. 6, wherein the parts corresponding to those in FIG. 3 are designated the same reference numerals and a repeated explanation thereof will be omitted.

In FIG. 6, the transistors $Q_{11}$, $Q_{12}$, $Q_{13}$ and $Q_{14}$ arranged in the current dividing circuit 3 of the current generating circuit 4 are constructed in the same manner as those in FIG. 3. Switching circuits 15, 16, 17 and 18 are respectively formed of three sets of switching transistors $Q_{18}$, $Q_{17}$ and $Q_{31}$; $Q_{19}$, $Q_{22}$ and $Q_{32}$; $Q_{24}$, $Q_{23}$ and $Q_{33}$; and $Q_{29}$, $Q_{28}$ and $Q_{34}$, among which the transistors $Q_{31}$, $Q_{32}$, $Q_{33}$ and $Q_{34}$ are switching transistors performing also the functions of the transistors $Q_{15}$ and $Q_{16}$; $Q_{20}$ and $Q_{21}$; $Q_{25}$ and $Q_{26}$; and $Q_{27}$ and $Q_{30}$, as shown in FIG. 3, respectively.

The respective sets of the three transistors $Q_{18}$, $Q_{17}$ and $Q_{31}$; $Q_{19}$, $Q_{22}$ and $Q_{32}$; $Q_{24}$, $Q_{23}$ and $Q_{33}$; and $Q_{29}$, $Q_{28}$ and $Q_{34}$ respectively constituting the four switching circuits 15, 16, 17 and 18 have their emitters commonly connected to the respective collectors of the transistors $Q_{11}$, $Q_{12}$, $Q_{13}$ and $Q_{14}$ in the current dividing circuit 3. The collectors of the respective transistors $Q_{31}$, $Q_{32}$, $Q_{33}$ and $Q_{34}$ in the switching circuits 15 to 18 are connected in common to the first output terminal $T_{16}$ for the upper digit, while the bases of the transistors and $Q_{33}$ and $Q_{33}$ are connected together to a control terminal $T_{19}$ which is supplied with a control pulse $B_1$ shown in FIG. 7. The bases of the transistors $Q_{32}$ and $Q_{34}$ are connected together to a control terminal $T_{18}$ which is supplied to a control pulse $B_2$ (with the opposite-phased pulse with respect to the control pulse $B_1$) as shown in FIG. 7.

The collectors of the transistors $Q_{17}$, $Q_{22}$, $Q_{23}$ and $Q_{28}$ are connected in common to form a current synthesizing circuit, the output terminal of which is connected to a second output terminal $T_{17}$ for the second most significant bit. The base of the transistor $Q_{17}$ is connected to a control terminal $T_{22}$ which is supplied with the control pulse $A_3$ shown in FIG. 7, while the base of the transistor $Q_{22}$ is connected to a control terminal $T_{23}$ which is supplied with the control pulse $A_4$ shown in FIG. 7. Further, the base of the transistor $Q_{23}$ is connected to a control terminal $T_{20}$ which is supplied with the control pulse $A_1$ shown in FIG. 7, while the base of the transistor $Q_{28}$ is connected to a control terminal $T_{21}$ which is supplied with the control pulse $A_2$ shown in FIG. 7. The control pulses $A_1$ to $A_4$ are four-phase pulses synchronized with the control pulses $B_1$ and $B_2$.

The collectors of the transistors $Q_{18}$, $Q_{19}$, $Q_{24}$ and $Q_{29}$ form a current synthesizing circuit the output terminal of which is connected to the output terminal $T_{14}$ which leads to the current generating circuit for the lower digit (not shown). The base of the transistor $Q_{18}$ is connected to the terminal $T_{20}$ which is supplied with the control pulse $A_1$ shown in FIG. 7. Likewise, the base of the transistor $Q_{19}$ is connected to the terminal $T_{21}$, the base of the transistor $Q_{24}$ to the control terminal $T_{22}$, and the base of the transistor $Q_{29}$ to the control terminal $T_{23}$, while these control terminals $T_{20}$, $T_{21}$, $T_{22}$ and $T_{23}$ are supplied with the control pulses $A_1$, $A_2$, $A_3$ and $A_4$ shown in FIG. 7, respectively.

The transistors $Q_{18}$ $Q_{19}$, $Q_{24}$ and $Q_{29}$ in the switching circuits 15 to 18 or the current synthesizing circuit formed by connecting their collectors makes the output current, obtained by dividing the input current I by four, pass therethrough for a quarter of one cyclic period T when the respective control pulses $A_1$ to $A_4$ are at the high level and delivers the same to the output of the current synthesizing circuit. The transistors $Q_{17}$, $Q_{22}$, $Q_{23}$ and $Q_{28}$ in the switching circuits 15 to 18 or the current synthesizing circuit formed by connecting their collectors makes the output current I/4, obtained by dividing the input current by four, pass therethrough for a quarter of one cyclic period T when the respective control pulses $A_3$, $A_4$, $A_1$ and $A_2$ are at the high level and delivers the same to the output of the current synthesizing circuit. Further, the two transistors $Q_{31}$ and $Q_{33}$ among the transistors $Q_{31}$ to $Q_{34}$, each of which takes the place of two switching transistors in the switching circuits 11-14 in FIG. 3, make the output current I/2 obtained by dividing the input current I by two pass therethrough for half the period T when the control pulse $B_1$ is at the high level. The high level period of the control pulse $B_1$ is coincident with the on-period or high level period of the control pulses $A_2$ and $A_4$.

In the same manner, the transistors $Q_{32}$ and $Q_{34}$ make the output current I/2 obtained by dividing the input current I by two pass therethrough for half the cyclic period T in which the control pulse $B_2$ is at the high level. The control pulse $B_2$ goes high in level in synchronism with the high level periods of the control pulses $A_1$ and $A_3$. Thus, the switching circuits 15 to 18 can constitute current synthesizing circuits which generate a first output current obtained by dividing the input current I by $2^n$ and a second output current obtained by dividing the input current I by $2^m$ (m=1, 2, 3 ... and m<n).

The above-mentioned embodiment was given to the case of the 2-bit current generating circuit 4 in which the switching transistors $Q_{31}$ to $Q_{34}$ are turned on twice by the control pulses $B_1$ and $B_2$ for one cyclic period T in which the control pulses $A_1$ to $A_4$ sequentially become the high level. If a 3-bit current generating circuit is concerned, for example, the second bit is applied with a control pulse which turns on the switching transistors twice within one cyclic period of the control pulse for the lower digit bit 20 corresponding to the control pulses $A_1$ to $A_4$ and the most significant bit is applied with a control pulse which turns on the switching transistors four times within the cyclic period T. The same can be adapted to the case of an n-bit current generating circuit.

In the above embodiment, the time period is weighted by the number of the control pulses $A_1$ to $A_4$. Alternatively, the weighting of the time may be effected by changing the pulse width of the control pulses.

Figure 8:
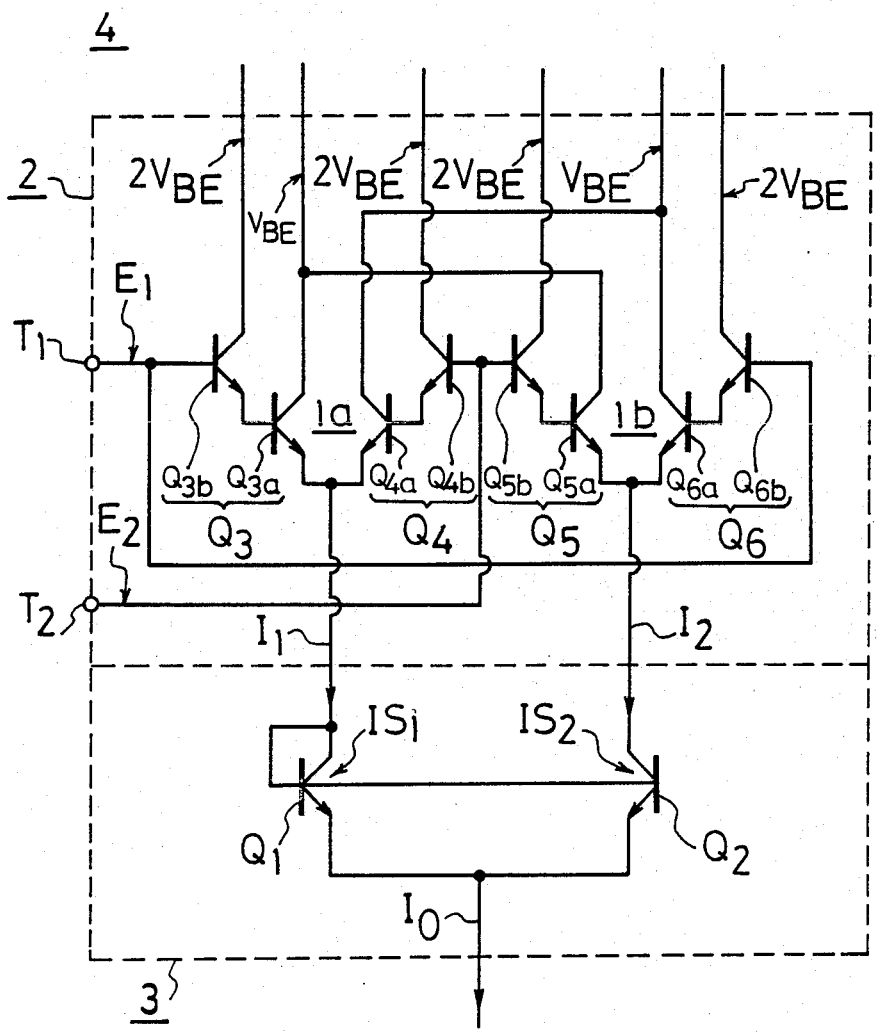
FIG. 8 is a schematic circuit diagram showing an embodiment of a differential switching circuit according to the present invention.

Next, an embodiment of a current change-over circuit according to the present invention will hereinafter be explained with reference to FIG. 8 in which the present invention is adapted to the current dividing circuit 3 to form the current generating circuit 4. The parts in FIG. 8 corresponding to those in FIG. 6 are designated the same reference numerals and a repeated explanation thereof will be omitted. Also, capacitors constituting low pass filters are not illustrated in FIG. 8.

The transistor circuits $Q_3$, $Q_4$, $Q_5$ and $Q_6$ of the differential switching circuits 1a and 1b in the current change-over circuit 2 are respectively formed of transistors $Q_{3a}$ and $Q_{3b}$; $Q_{4b}$ and $Q_{4b}$; $Q_{5a}$ and $Q_{5b}$; and $Q_{6a}$ and $Q_{6b}$, each being connected in a Darlington configuration.

Figure 1:
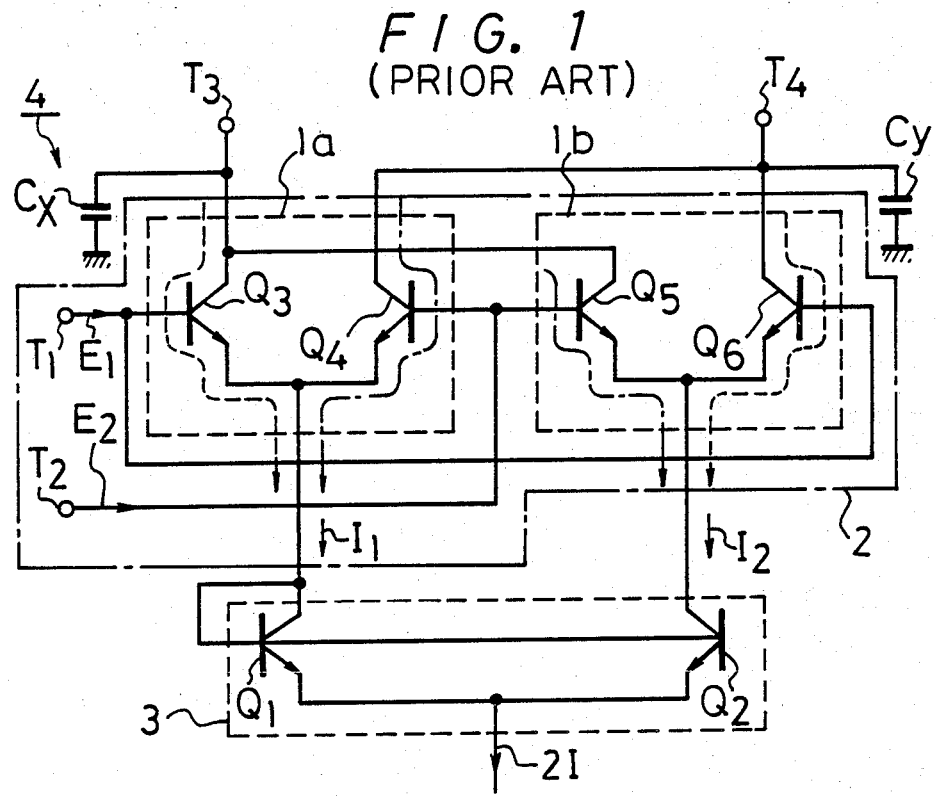
FIG. 1 is a schematic circuit diagram showing a previously proposed current generating circuit.
Figure 2:
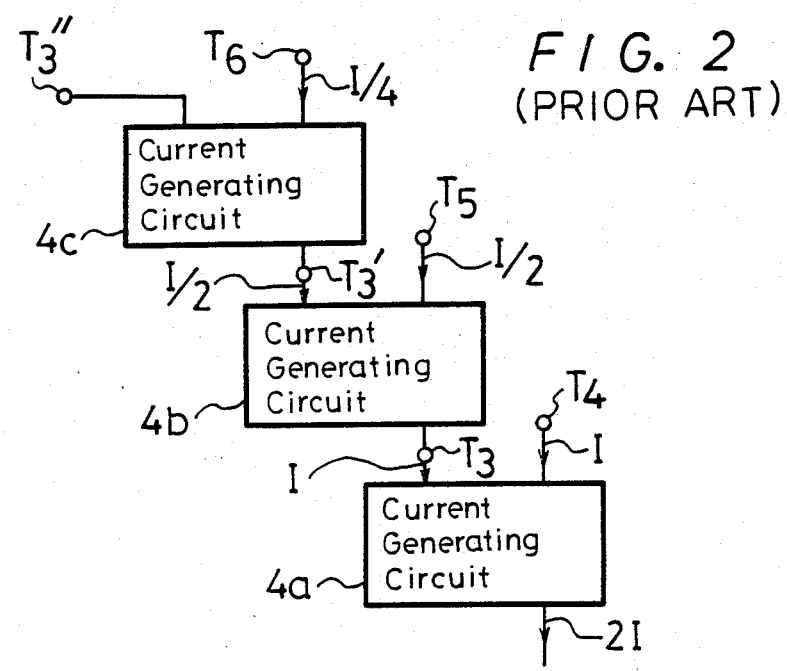
FIG. 2 is a block circuit diagram showing a previously proposed current generating circuit.

The emitters of the transistors $Q_{3b}$, $Q_{4b}$, $Q_{5b}$ and $Q_{6b}$ are respectively connected to the bases of the transistor $Q_{3a}$, $Q_{4a}$, $Q_{5a}$ and $Q_{6a}$. The emitters of the transistors $Q_{3a}$ and $Q_{4a}$ are connected in common to a current source $IS_1$, while the emitters of the transistors $Q_{5a}$ and $Q_{6a}$ are connected in common to a current source $IS_2$. Further, the input terminal $T_1$ which is applied with the switching signal (refer to FIG. 1) is connected to the bases of the transistors $Q_{3b}$ and $Q_{6b}$ in common, while the input terminal $T_2$ which is applied with another switching signal is connected to the bases of the transistors $Q_{4b}$ and $Q_{5b}$ in common.

The collectors of the transistors $Q_{3a}$ and $Q_{5a}$ are connected with each other, and the potential $V_{BE}$ at the connecting point therebetween becomes the minimal operating voltage for the emitter voltage (hereinafter referred to as "reference potential") of the transistors $Q_{3a}$ and $Q_{5a}$. The collectors of the transistors $Q_{4a}$ and $Q_{6a}$ are connected to each other, and the minimal operating voltage at the connecting point therebetween with respect to the reference potential is $V_{BE}$. Therefore, if these connecting points are connected to the current dividing circuit in the next stage, the elevation of the minimal operating voltage due to the multi-state connection can be suppressed.

Since the minimal operating voltage with respect to the reference potential of each collector of the transistors $Q_{3b}$ to $Q_{6b}$ is $2V_{BE}$, these collectors are connected to a high voltage level ($2V_{BE}$) in the next stage.

Next, an example of connecting the current generating circuit 4 formed of the current dividing circuit 3 and the current change-over circuit 2 shown in FIG. 8 in two stages is explained with reference to FIG. 9. In this example, reference numeral 4 designates a current generating circuit in the first stage to which a current dividing circuit 4' in the next stage is connected. In the next stage, only a current dividing circuit 3' is illustrated.

The collectors of the transistors $Q_{3a}$ and $Q_{5a}$ arranged in the current change-over circuit 2 in the first stage current generating circuit 4 are connected to the output terminal $T_3$, and further to the emitters of the transistors $Q'_1$ and $Q'_2$ of the current dividing circuit 3' in the next stage in common. The collectors of the transistors $Q_{4a}$, $Q_{4b}$, $Q_{6a}$ and $Q_{6b}$ are connected in common to the output terminal $T_4$ as well as to ground through a capacitor $C_y$ constituting a low pass filter. Further, the collector of the transistor $Q_{3b}$ is connected to the base of the transistor $Q'_1$ output terminal $T_5$, while the collector of the transistor $Q_{5b}$ is connected to the collector of the transistor $Q'_2$ through the output terminal $T_6$.

Since the minimal operating voltage of the collectors of the transistors $Q_{3a}$ and $Q_{5a}$ with respect to the reference voltage is $V_{BE}$, these collectors are respectively connected to the emitters of the transistors $Q'_1$ and $Q'_2$ in the current dividing circuit 3'. Meanwhile, since the minimal operating voltage of the collectors of the transistors $Q_{3b}$ and $Q_{5b}$ with respect to the reference potential is $2V_{BE}$, these collectors are respectively connected to the collectors of the transistors $Q'_1$ and $Q'_2$.

In this construction, the output current delivered to the output terminal $T_3$ (called "the main current") is represented $I_0'$, and the output current delivered to the output terminal $T_4$ by $I_{01}$. The collector current of the transistor $Q_{3b}$ (called "the correcting current") is represented by $I_5$, the collector current of the transistor $Q_{5b}$ (also called "the correcting current") by $I_9$. The collector currents of the transistors $Q'_1$ and $Q'_2$ of the current dividing circuit 3' are represented by $I_1'$ and $I_2'$, respectively.

Now, if the difference between the currents $I_1$, $I_2$ and $I_0/2$ ($I_0$ is an input current) is represented by $\pm\Delta_1$, and the difference between the currents $I'_1$, $I'_2$ and $I_0'/2$ by $\pm\Delta_2$, the currents $I_1$, $I_2$, $I'_1$ and $I'_2$ are expressed by the following equations:

$$I_1 = I_0/2 + \Delta_1 \quad (1)$$

$$I_2 = I_0/2 - \Delta_1 \quad (2)$$

$$I'_1 = I_0/4 + \Delta_2 - (I_0 + 2\Delta_1) \cdot \{(\tfrac{1}{2})(1 + \beta_{3a}) \cdot (1 + \beta_{3b})\} \quad (3)$$

$$I'_2 = I_0/4 - \Delta_2 - (I_0 + 2\Delta_1) \cdot \{(\tfrac{1}{2})(1 + \beta_{5a}) \cdot (1 + \beta_{5b})\} \quad (4)$$

where $\beta_{3a}$, $\beta_{3b}$, $\beta_{5a}$ and $\beta_{5b}$ are the factors $\beta$ of the respective transistors $Q_{3a}$, $Q_{3b}$, $Q_{5a}$ and $Q_{5b}$.

It is understood from the equations (1) to (4) that even without connecting the collectors of the transistors $Q_{3a}$ and $Q_{3b}$, and those of the transistors $Q_{5a}$ and $Q_{5b}$ connected in Darlington configuration for forming the transistor circuits $Q_3$ and $Q_5$, the respective emitters, bases and collectors thereof have the same current relationship as in the case where the collectors are connected to each other, and accordingly the factors $\beta$ thereof can be made larger.

Figure 10:
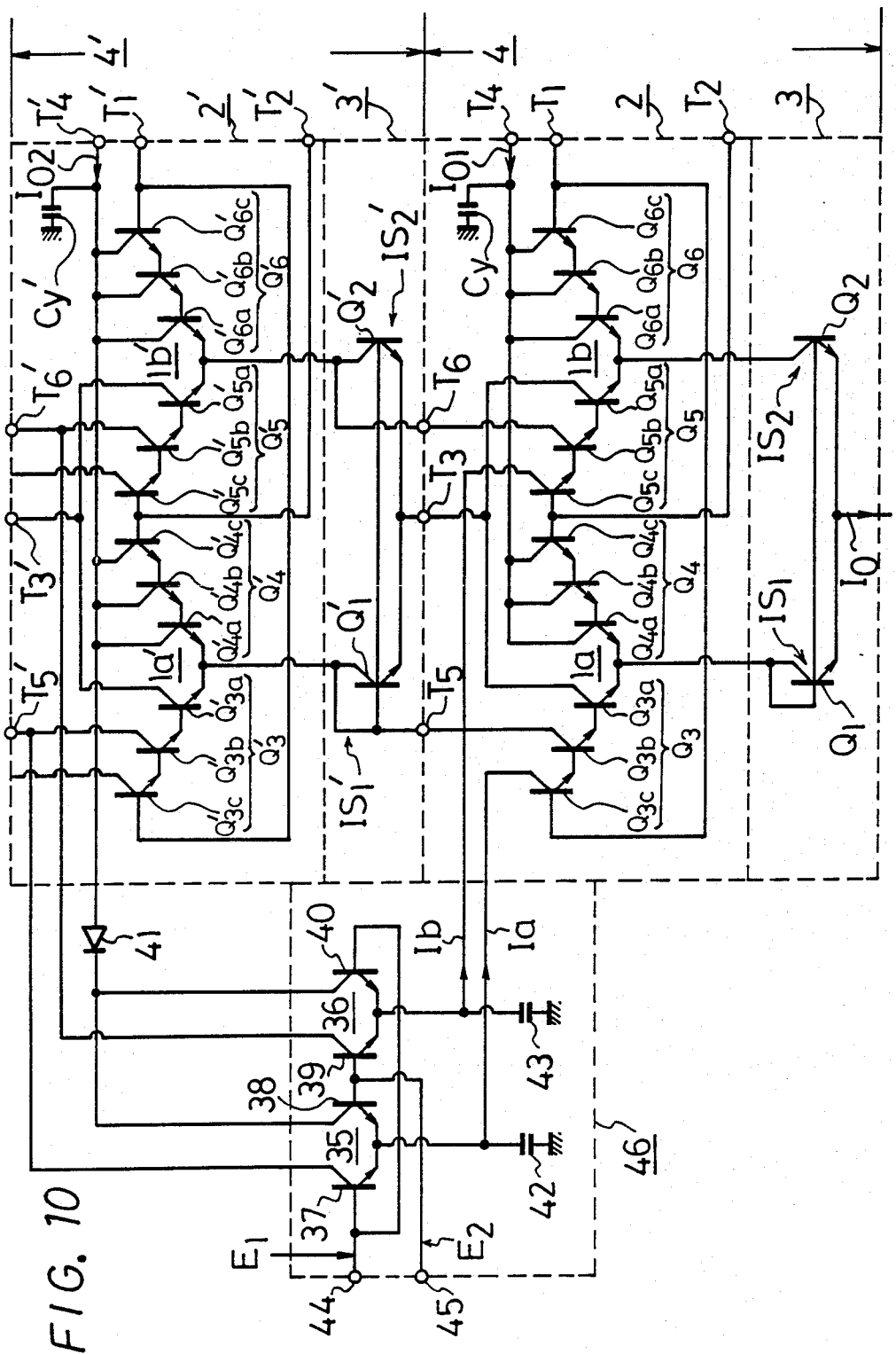
FIG. 10 is a schematic circuit diagram showing a further embodiment of the present invention.

Next, a further embodiment of the present invention will be explained with reference to FIG. 10. This embodiment is such that the current generating circuit 4 at the first stage is connected to a current generating circuit 4' at the next stage, wherein transistor circuits $Q_3$ to $Q_6$ and $Q'_3$ to $Q'_6$ of their current change-over circuits 2 and 2' are respectively formed of Darlington-connected three-stage transistors $Q_{3a}$, $Q_{3b}$, and $Q_{3c}$ to $Q_{6a}$, $Q_{6b}$, and $Q_{6c}$, and $Q'_{3a}$, $Q'_{3b}$, and $Q'_{3c}$ to $Q'_{6a}$, $Q'_{6b}$, and $Q'_{6c}$.

Since there are provided the Darlington-connected three-stage transistors, the accuracy of the output current with respect to the input current can be correspondingly improved. However, the three stage configuration causes the minimal operating voltage of the collector to be increased to $3V_{BE}$ with respect to the reference potential, so that a voltage compensating circuit 46 is required between the current change-over circuits 2 and 2'.

This voltage compensating circuit 46 will hereinafter be explained.

The voltage compensating circuit 46 comprises a pair of differential switching circuits 35 and 36 which are formed of transistors 37 and 38, and 39 and 40, respectively. The emitters of the transistors 37 and 38 are connected in common, and the connecting point thereof is grounded through a capacitor 42 constituting a low pass filter. In the same manner, the emitters of the transistors 39 and 40 are connected in common, and the connecting point thereof is grounded through a capacitor 43 constituting a low pass filter.

Input terminals 44 and 45, which correspond to the input terminals $T_1$ and $T_2$ through which the switching signals $E_1$ and $E_2$ are supplied to the current generating circuit 4 at the first stage, are fed with the same switching signals $E_1$ and $E_2$, respectively. The switching signal input terminal 44 is connected in common to the bases of the transistors 37 and 40, while the switching signal input terminal 45 is connected in common to the bases of the transistors 38 and 39.

In the current change-over circuit 2 in the current generating circuit 4 a the first stage, the collectors of the transitors $Q_{3a}$ and $Q_{5a}$ are connected in common, and the connecting point thereof is connected through the output terminal $T_3$ to the emitters of the the transistors $Q'_1$ and $Q'_2$ of the current dividing circuit 3' in the current generating circuit 4' at the next stage. The collectors of the transitors $Q_{4a}$, $Q_{4b}$, $Q_{4c}$, $Q_{6a}$, $Q_{6b}$ and $Q_{6c}$ are connected in common to the output terminal $T_4$. The collector of the transistor $Q_{3b}$ is connected through the output terminal $T_5$ to the collector of the transistor $Q'_1$ of the current dividing circuit 3'. The collector of the transistor $Q_{5b}$ is connected through the output terminal $T_6$ to the collector of the transistor $Q'_2$ of the current dividing circuit 3'. The collector of the transistor $Q_{3c}$ is connected to the emitters of the respective transistors 37 and 38 of the voltage compensating circuit 46, while the collector of the transistor $Q_{5c}$ is connected to the emitters of the respective transistors 39 and 40 thereof.

The current change-over circuit 2' in the current generating circuit 4' at the next stage has the collectors of the transitors $Q'_{3a}$ and $Q'_{5a}$ connected with each other, and the connecting point thereof is connected, through an output terminal $T'_3$, commonly to the emitters of the transitors of a current dividing circuit in a current generating circuit (not shown) at the third stage. The collectors of the transistors $Q'_{4a}$, $Q'_{4b}$, $Q'_{4c}$, $Q'_{6a}$, $Q'_{6b}$ and $Q'_{6c}$ are connected in common to an output terminal $T'_4$ as well as to the collectors of the transistors 38 and 40 of the voltage compensating circuit 46 through the anode-cathode path of a diode 41. The collector of the transistor $Q'_{3b}$ is connected to the base of the transistor of the current dividing circuit in the current generating circuit at the third stage through an output terminal $T'_5$ as well as to the collector of the transistor 37 of the voltage compensating circuit 46. The collector of the transitor $Q'_{5b}$ is connected through an output terminal $T'_6$ to the collector of the transistor of the current dividing circuit in the current generating circuit at the third stage as well as to the collector of the transistor 39 of the voltage compensating circuit 46.

Incidentally, the voltage compensating circuit 46 also has a function of averaging currents Ia and Ib which are applied respectively to the collectors of the transistors $Q_{3c}$ and $Q_{5c}$ of the current change-over circuit 2 in the current generating circuit 4 at the first stage.

Particularly in the present embodiment, the collector of the transistor $Q_{3c}$, the minimal operating voltage of which is $3V_{BE}$ with respect to the reference potential, in the current change-over circuit 2 in the current generating circuit 4 at the first stage, is connected to the collector of the transistor $Q'_{3b}$ of the current change-over circuit 2' in the current generating circuit 4' at the next stage through the emitter-to-collector path of the transistor 37 as well as to the collector of the transistor $Q'_{4a}$ of the current change-over circuit 2' through the emitter-to-collector path of the transistor 38 and the diode 41. Similarly, the collector of the transistor $Q_{5c}$, the minimal operating voltage of which is $3V_{BE}$ with respect to the reference potential, constituting the current change-over circuit 2 in the current generating circuit 4 at the first stage, is connected to the collector of the transitor $Q'_{5b}$ of the current change-over circuit 2' in the current generating circuit 4' at the next stage through the emitter-to-collector path of the transistor 39 in the voltage compensating circuit 46 as well as to the collector of the transistor $Q'_{4a}$ of the current change-over circuit 2' through the emitter-to-collector path of the transistor 40 and the diode 41.

Figure 9:
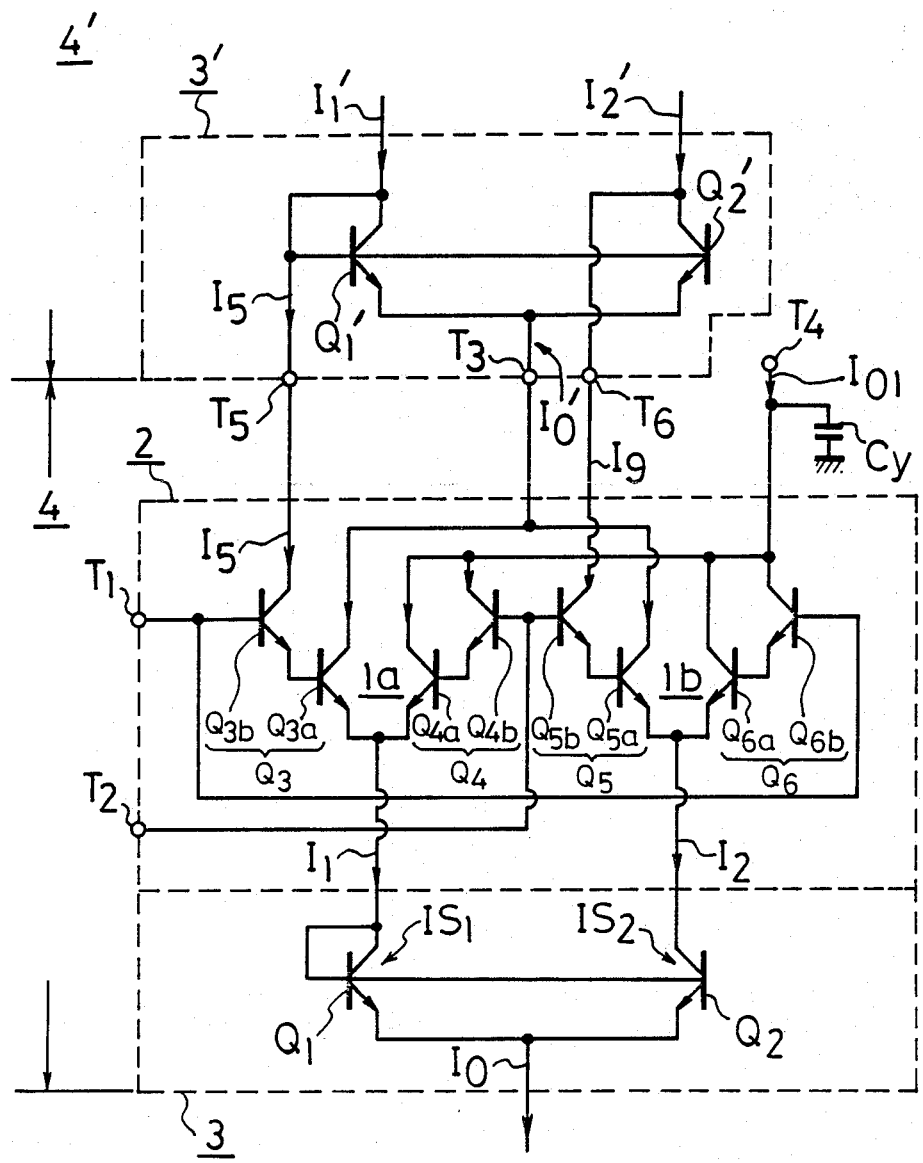
FIG. 9 is a schematic circuit diagram showing another embodiment of a differential switching circuit according to the present invention.

The rest of the present embodiment is constructed in the same manner as the construction shown in FIG. 9, so that the repeated explanation thereof will be omitted.

According to the construction of the change-over circuit of the present invention as set forth above, as the number of processing bits is increased, the number of transistors which are used to turn on the single current dividing circuit can be further reduced. Accordingly, assuming that the number of processing bits is n, the number of transistors necessary to turn on each of the transistors constituting the current dividing circuit can be reduced from $2^n$ to $n+1$, which is greatly effective in constructing a current generating circuit for a highly accurate D/A converter or the like.

Also, since the current generating circuit of the present invention is provided with output terminals arranged in parallel corresponding to the number of the processing bits by connecting a plurality of current generating circuits in a piling manner, the number of the processing bits can be increased in a predetermined stage, thereby making it possible to largely reduce the number of piled stages, the number of elements in the change-over circuit and the operating source voltage.

Particularly, since the current dividing circuit in Darlington configuration according to the present invention can suppress errors in the output current with respect to the input current as well as divide the input current with high accuracy, it is possible to prevent the elevation of the minimal operating voltage when the current dividing circuits are connected in multiple stages.

The above description is given on preferred embodiments of the invention but it will be apparent that many modifications and variations could be effected by one skilled in the art without departing from the spirit or scope of the novel concepts of the invention.

I claim as my invention:

1. A current generating circuit for generating a plurality of currents accurately in a predetermined integer ratio, comprising:
   (a) a current dividing circuit for dividing an input current into $2^n$ (n is a positive integer) output currents;
   (b) a current change-over circuit for switching respective output currents from said current dividing circuit in a predetermined ratio and providing an output current in response to a predetermined number of clock signals in one cyclic period fed to input terminals of said change-over circuit; and
   (c) a plurality of current synthesizing circuits for synthesizing output currents from said current dividing circuits and generating a corresponding plurality of output currents in the predetermined ratio in response to a predetermined number of current synthesizing signals in said one cyclic period.

2. A current generating circuit as claimed in claim 1, wherein said current change-over circuit comprises at least two transistors, and one of said change-over clock signals is supplied to an input terminal of each of the transistors.

3. A current generating circuit as claimed in claim 1; and further comprising a capacitor connected between an output terminal and a reference voltage for forming a low-pass filter for a current flowing at said output terminal.

4. A current generating circuit as claimed in claim 1, wherein said current dividing circuit, said current change-over circuit and said current synthesizing circuits are formed of bipolar transistors.

5. A current generating circuit as claimed in claim 1, wherein each of said current synthesizing circuits is a differential amplifier circuit formed of a pair of transistors each of which is supplied with one of said current synthesizing signals at their respective bases.

6. A current generating circuit as claimed in claim 5, wherein said differential amplifier circuit is constructed in a Darlington configuration.

7. A current generating circuit for generating a plurality of currents accurately in a predetermined integer ratio, comprising:
   (a) at least two sets of current dividing devices each of said sets comprising a current dividing circuit for dividing an input current into $2^n$ (n is a positive integer) output currents, a plurality of current change-over circuits for dividing respective output currents from said current dividing circuit in a predetermined ratio and a current synthesizing circuit for synthesizing output currents from said respective current change-over circuits and producing a plurality of currents in a predetermined ratio; and
   (b) a voltage compensating circuit connected to an output terminal of a second one of said at least two sets of current dividing devices and to a current change-over circuit control signal for shifting the voltage level of first input voltage said control signal in response to the output of the second one of said at least two sets of current dividing devices.

8. A current generating circuit as claimed in claim 3, wherein said current change-over circuits are of differential type arranged in at least a two-stage Darlington configuration.

9. A current generating circuit as claimed in claim 8, wherein a pair of collectors in a first one of said at least two sets of current dividing devices, connected to a high voltage level relative to a reference potential, of said transistors in at least a two-stage Darlington configuration are connected to the high voltage level of the current dividing circuit in the second one of said two sets of current dividing devices.

10. A current generating circuit as claimed in claim 8, wherein an output terminal of transistors constituting a pair of Darlington configurations in a first one of said two sets of current dividing devices is connected to the high voltage level relative to a reference potential of said current dividing circuit in the second one of said at least two sets of current dividing devices, and an output signal from said voltage compensating circuit is supplied to an input terminal of the transistors constituting a pair of Darlington configurations in the second one of said at least two sets of current dividing devices.

* * * * *

UNITED STATES PATENT AND TRADEMARK OFFICE
CERTIFICATE OF CORRECTION

PATENT NO. : 4,874,964

DATED : October 17, 1989

INVENTOR(S) : Tetsuya Kondo

It is certified that error appears in the above-identified patent and that said Letters Patent is hereby corrected as shown below:

Col. 1, line 37, after "are" insert --connected--

Col. 2, line 21, after "currents" insert --,-- line 31, change "b" to --by-- line 32, change "acco" to --accor---

Col. 4, line after "source" insert --)--

Col. 6, lines 49 & 50, change "and Q33" to --Q21--

Col. 8, line 68, after "Q1" insert --through the --

Col. 9, line 14, after "represented" insert --by--

Col. 10, line 23, change "a" to --at--

UNITED STATES PATENT AND TRADEMARK OFFICE
CERTIFICATE OF CORRECTION

PATENT NO. : 4,874,964

DATED : October 17, 1989

INVENTOR(S) : Tetsuya Kondo

It is certified that error appears in the above-identified patent and that said Letters Patent is hereby corrected as shown below:

In claims

Column 12, line 55, change "claim 3" to --claim 7--.

Signed and Sealed this

Sixth Day of November, 1990

Attest:

HARRY F. MANBECK, JR.

*Attesting Officer*   *Commissioner of Patents and Trademarks*